United States Patent
Zwieback et al.

(10) Patent No.: US 9,017,629 B2
(45) Date of Patent: Apr. 28, 2015

(54) INTRA-CAVITY GETTERING OF NITROGEN IN SIC CRYSTAL GROWTH

(75) Inventors: Ilya Zwieback, Washington Township, NJ (US); Donovan L. Barrett, Port Orange, FL (US); Avinash K. Gupta, Basking Ridge, NJ (US)

(73) Assignee: II-VI Incorporated, Saxonburg, PA (US)

( * ) Notice: Subject to any disclaimer, the term of this patent is extended or adjusted under 35 U.S.C. 154(b) by 1728 days.

(21) Appl. No.: 12/067,258

(22) PCT Filed: Sep. 27, 2006

(86) PCT No.: PCT/US2006/037968
§ 371 (c)(1),
(2), (4) Date: Aug. 20, 2008

(87) PCT Pub. No.: WO2007/038710
PCT Pub. Date: Apr. 5, 2007

(65) Prior Publication Data
US 2009/0169459 A1    Jul. 2, 2009

Related U.S. Application Data

(60) Provisional application No. 60/721,455, filed on Sep. 28, 2005.

(51) Int. Cl.
*C01B 31/36* (2006.01)
*C30B 23/00* (2006.01)
*C30B 29/36* (2006.01)
*H01L 21/02* (2006.01)

(52) U.S. Cl.
CPC .................. *C30B 29/36* (2013.01); *C30B 23/00* (2013.01); *H01L 21/02378* (2013.01); *H01L 21/02529* (2013.01); *H01L 21/02576* (2013.01); *H01L 21/02631* (2013.01)

(58) Field of Classification Search
None
See application file for complete search history.

(56) References Cited

U.S. PATENT DOCUMENTS

| | | | |
|---|---|---|---|
| 4,750,969 A | 6/1988 | Sassa et al. | |
| 5,425,966 A * | 6/1995 | Winter et al. | 427/255.36 |
| 5,937,317 A * | 8/1999 | Barrett et al. | 438/493 |
| 6,086,672 A | 7/2000 | Hunter | |
| 6,503,322 B1 | 1/2003 | Schrenker et al. | |
| 6,508,880 B2 | 1/2003 | Vodakov et al. | |
| 2003/0094132 A1 | 5/2003 | Vodakov et al. | |
| 2006/0254505 A1* | 11/2006 | Tsvetkov et al. | 117/104 |

FOREIGN PATENT DOCUMENTS

JP    11-157988 A    6/1999

* cited by examiner

*Primary Examiner* — Bijay Saha
(74) *Attorney, Agent, or Firm* — The Webb Law Firm

(57) ABSTRACT

In method of crystal growth, an interior of a crystal growth chamber (2) is heated to a first temperature in the presence of a first vacuum pressure whereupon at least one gas absorbed in a material (4) disposed inside the chamber is degassed therefrom. The interior of the chamber is then exposed to an inert gas at a second, higher temperature in the presence of a second vacuum pressure that is at a higher pressure than the first vacuum pressure. The inert gas pressure in the chamber is then reduced to a third vacuum pressure that is between the first and second vacuum pressures and the temperature inside the chamber is lowered to a third temperature that is between the first and second temperatures, whereupon source material (10) inside the chamber vaporizes and deposits on a seed crystal (12) inside the chamber.

8 Claims, 2 Drawing Sheets

INTRA-CAVITY GETTERING OF NITROGEN IN SIC CRYSTAL GROWTH

BACKGROUND OF THE INVENTION

Semi-insulating SiC crystals are grown to obtain SiC wafers having a resistivity above $10^5$ ohm-cm for use as substrates in the fabrication of microwave devices. As nitrogen is a known donor impurity in the growth of semi-insulating SiC crystals, it is necessary during said growth to remove nitrogen to very low concentration values, e.g., generally to less than $10^{16}$ nitrogen atoms/cm$^3$, in order to achieve acceptable levels of resistivities in the grown SiC crystals.

Since Nitrogen is the major component of the atmosphere, SiC crystals are grown within a high vacuum furnace to remove nitrogen to very low concentration. SiC crystals can be grown by a physical vapor transport (PVT) technique by sublimation of SiC and deposition of the resultant vapor on a single crystal seed of SiC. This process generally occurs at high temperatures in excess of 2000° C. These high temperatures are achieved using an induction-heated graphite susceptor insulated from the furnace wall using sections of porous low-density graphite foam.

A problem with this SiC crystal growth technique is the use of graphite components, including the susceptor, the crucible and heat shields made of dense graphite, as well as thermal insulation made of porous, low-density graphite. Specifically, due to its porosity, graphite is generally capable of absorbing large quantities of gas, e.g., up to 100 cc of air per gram of graphite. Placed inside the growth chamber, graphite is the principle source of nitrogen contamination in the growth of SiC crystals.

Residual nitrogen content inside the crystal growth chamber can be reduced by common and well-known techniques that can be applied prior to growth. Examples of such techniques include: purging the crystal growth chamber with inert gas, or high-temperature heating under high vacuum and by the use of external getters such as heated titanium. Despite using the above techniques, SiC crystals grown in such conditions still contain undesirable levels of nitrogen, especially in the first-to-grow portions of the crystal, that adversely affect the resistivity of SiC wafers obtained therefrom.

The undesirable level of nitrogen in a SiC crystal is due to the desorption of nitrogen from graphite components—a process that occurs at the temperatures of SiC crystal growth. As a result, the nitrogen donor concentration can become comparable or higher than that of the deep-level centers that are responsible for the electrical compensation of the crystal, especially in the first-to-grow portions of the crystal. Wafers sliced from portions of the crystal having too much nitrogen are not fully compensated, are less resistive and, therefore, less useful.

SUMMARY OF THE INVENTION

The present invention is a method of growing a crystal inside a crystal growth chamber. The method includes (a) providing a crystal growth chamber having therein at least one component formed of a material that absorbs at least one gas that is a donor impurity in the growth of crystals in the chamber, said chamber further including therein a source material and a seed crystal; (b) heating the interior of the chamber to a first, elevated temperature in the presence of a first pressure whereupon the combination of the first temperature and the first pressure is sufficient to degas the at least one gas from the component; (c) exposing the interior of the chamber to an inert gas at a second, elevated temperature in the presence of a second pressure, wherein the second temperature is higher than the first temperature and higher than a desired crystal growth temperature which is also higher than the first temperature, and the second pressure is at a higher pressure than the first pressure; (d) reducing the inert gas pressure in the chamber to a third pressure that is between the first pressure and the second pressure; and (e) lowering the temperature inside the chamber to a third, desired crystal growth temperature whereupon the source material sublimates (changes from a solid into a vapor) and the vapor from said sublimation deposits on the seed crystal.

Steps (b)-(e) desirably occur in the listed order. Steps (b)-(e) desirably occur absent exposing the interior of the chamber to the ambient atmosphere and/or absent exposing the interior of the chamber to temperature less than the first temperature.

Step (b) can be performed for a period between 12 and 18 hours. Step (c) can be performed for a period of between 18 and 30 hours.

The first temperature can be about 1200° C. The second temperature can be 50 to 150° C. above the third temperature. The third temperature can be between 2000 and 2400° C.

The first pressure can be between $10^{-5}$ and $10^{-7}$ Torr. The second pressure can be between 200 and 600 Torr. The third pressure can be between 1 and 100 Torr.

The seed crystal and the crystal being grown can be made from SiC.

The invention is also a crystal produced according to the foregoing method.

DETAILED DESCRIPTION OF THE INVENTION

Figure 1:
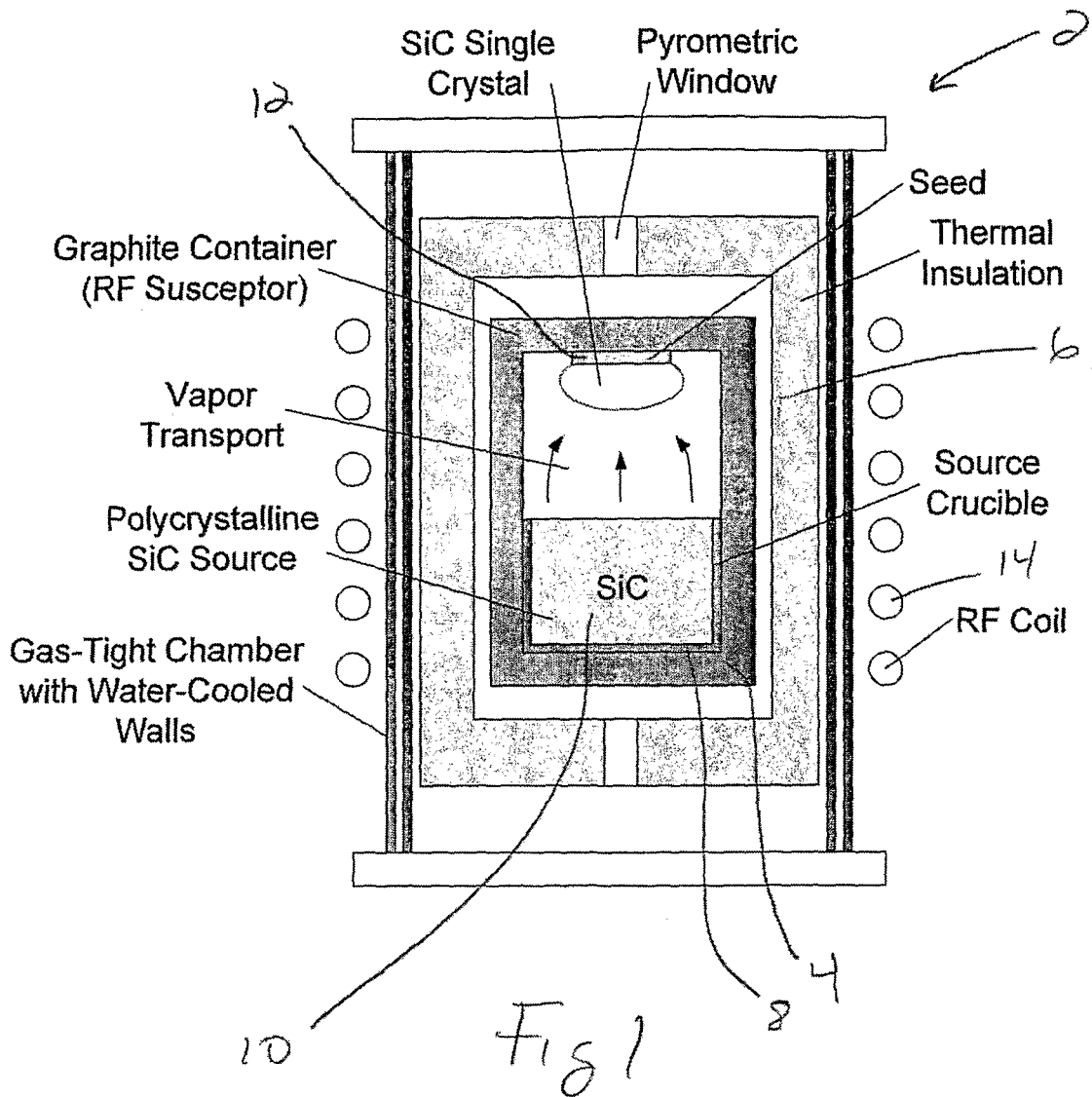
FIG. 1 is a schematic, cross-sectional view of a crystal growth chamber that can be utilized to realize the present invention.

The present invention is an in-situ gettering process that utilizes the ability of graphite to preferentially absorb nitrogen from a mixture with inert gas, such as argon or helium. In the process, graphite components act as nitrogen getters that remove residual nitrogen from the chamber during crystal growth. This in-situ gettering process is achieved in the following three steps which will be described with reference to the accompanying FIG. 1:

Step 1. Degassing.

A growth chamber 2 is loaded with a graphite container (a.k.a., a graphite susceptor) 4 surrounded by insulation 6. Graphite container 4 houses a source crucible 8, including source material 10 disposed therein, and a SiC seed crystal 12, along with any other necessary components (not shown) utilized in connection with normal SiC crystal growth techniques during growth of said SiC crystal. Growth chamber 2 has associated therewith one or more RF coils 14 which are operative for heating any graphite disposed in growth chamber 2, including, without limitation, graphite container 4 and, thereby, source material 10 and seed crystal 12 to a desired temperature.

Graphite container 4 is heated to ~1200° C. via RF coils 14 in the presence of pressure (vacuum) between $10^{-5}$ and $10^{-7}$ Torr and soaked at this temperature and pressure over a period of time, e.g., without limitation, 12 to 18 hours, sufficient to degas a desired amount of gas from any graphite disposed in growth chamber 2. During this time, degassing and removal of a major portion of the gas, including nitrogen, absorbed by any graphite, e.g., graphite container 4, disposed in growth chamber 2 takes place.

Step 2. Activation of Graphite.

To serve as a getter (absorbing medium) any graphite inside of growth chamber 2, including, without limitation, graphite container 4, must be activated, i.e., a more deep removal of the absorbed nitrogen from the graphite must be accomplished. In order to achieve this after Step 1 is complete, growth chamber 2 is filled with a pure inert gas, e.g., without limitation, argon, to a pressure (vacuum) of 200-600 Torr at a flow of rate of approximately 200 to 500 cc/min. Graphite container 4 is then heated to 50° to 150° Centigrade above a desired crystal growth temperature which is typically between 2000° C. and 2400° C. At this temperature, gas residing inside the graphite escapes into the atmosphere in growth chamber 2 where it mixes with argon. Purging growth chamber 2 with the flow of inert gas reduces the nitrogen content in the atmosphere of growth chamber 2 while the gas pressure of the inert gas in growth chamber 2 avoids vapor transport from source material 10 to seed crystal 12. Growth chamber 2 is soaked in at this temperature and pressure for a period of time, e.g., without limitation, 18 to 30 hours, sufficient to remove a desired amount of nitrogen from the atmosphere in growth chamber 2

Step 3. In-Situ Nitrogen Gettering.

Following Step 2, the inert gas pressure in growth chamber 2 is reduced to a typical growth pressure (vacuum) of 1 to 100 Torr, and, simultaneously, the temperature of graphite container 4 is lowered to the desired crystal growth temperature. At this temperature and pressure, active vapor transport and growth of the SiC crystal takes place. More specifically, source material 10 sublimates (changes from a solid into a vapor) and the vapor from said sublimation deposits on the SiC seed crystal 12 whereupon growth of the SiC crystal takes place. Inasmuch as the graphite forming growth chamber 2 or the graphite inside of the growth chamber 2 has been activated, crystal growth is accompanied by in-situ preferential adsorption (gettering) of nitrogen from the gas mixture in growth chamber 2 by the graphite forming growth chamber 2 or any graphite disposed inside of growth chamber 2. This results in a reduction of the nitrogen partial pressure in the chamber and, accordingly, in a reduction of nitrogen in the growing crystal.

Example

It has been observed that in-situ nitrogen gettering significantly increases the number of wafers in the SiC boule having a resistivity above $10^5$ ohm-cm.

Figure 2:
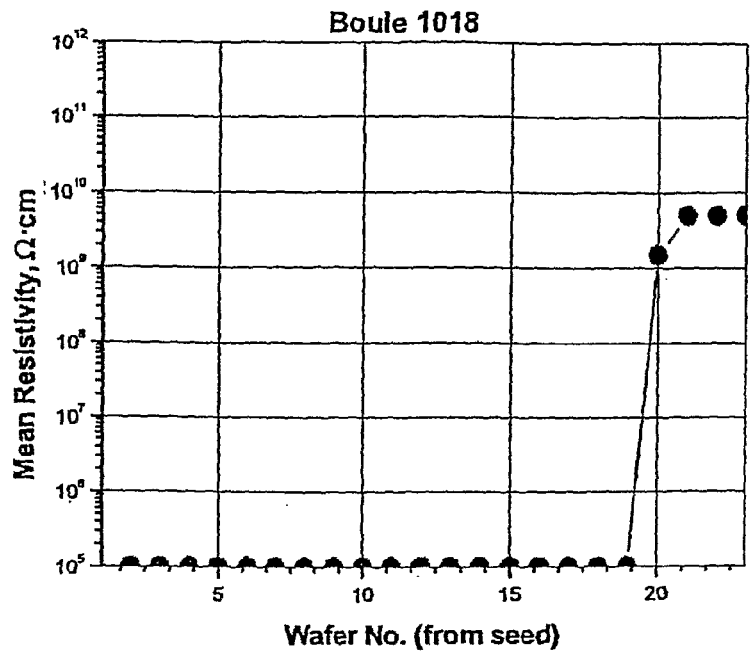
FIG. 2 is a graph of wafer number vs. resistivity (axial resistivity profile) of a crystal grown in accordance with a prior art method of crystal growth.

The effect of nitrogen background on the resistivity of nominally undoped SiC crystals is illustrated in FIG. 2 which shows an axial resistivity profile of an undoped crystal #1018 grown without in-situ nitrogen gettering in accordance with the present invention. As can be seen, the resistivity of almost the entire boule is low, i.e., less than $10^5$ ohm-cm. Impurity analysis of this boule has shown that the low resistivity in this crystal is due to the presence of nitrogen. With the progression of boule growth, however, the nitrogen content in the growth chamber atmosphere reduces as a result of nitrogen incorporation into the growing crystal. Accordingly, the nitrogen concentration in the crystal also reduces in the axial direction from seed to tail. In the last-to-grow portions of this crystal, the nitrogen concentration is reduced to a degree whereupon the material reached a high degree of compensation and a sufficiently high resistivity of above $10^5$ ohm-cm. From this crystal, only 3 or 4 wafers obtained from the ingot dome were considered to be semi-insulating, i.e., having a resistivity of above $10^5$ ohm-cm.

Figure 3:
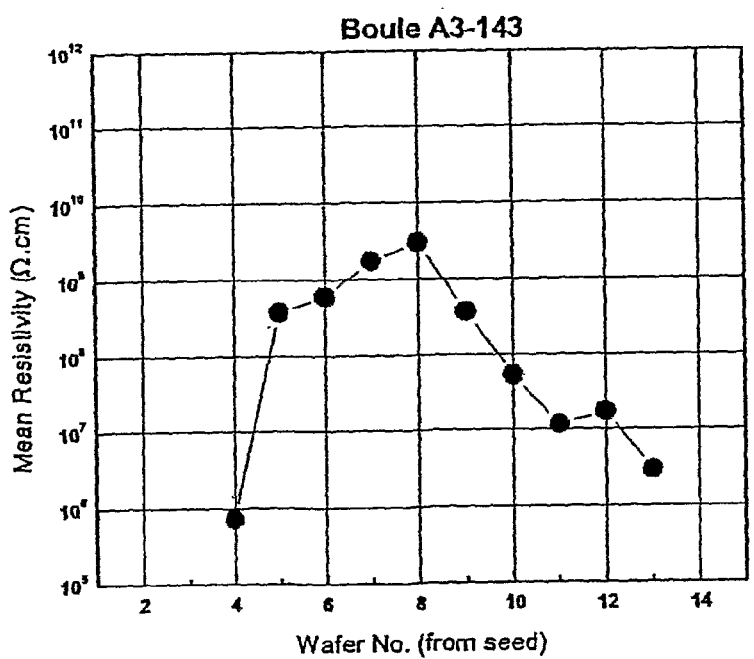
FIG. 3 is a graph of wafer number vs. resistivity (axial resistivity profile) of a crystal grown in accordance with the method of the present invention.

The effect of in-situ nitrogen gettering by activated graphite, in accordance with the present invention, is demonstrated in FIG. 3. As can be seen, as a result of gettering by the graphite in growth chamber 2, the nitrogen concentration in the crystal is reduced. This led to a higher resistivity and a longer length of useful high resistivity crystal. As shown in FIG. 3, ten (10) semi-insulating wafers were obtained from this ingot with a resistivity greater than $10^5$ ohm-cm.

CONCLUSION

As can be seen, the present invention enables in-situ activation of the graphite inside a crystal growth chamber 2 and the use of such activated graphite material for in-situ gettering of nitrogen from the crystal growth chamber atmosphere during crystal growth. Use of the present invention enables growth of SiC crystals with a nitrogen concentration of less than $10^{16}$ nitrogen atoms/cm$^3$ and an increase in the yield of prime semi-insulating wafers from a crystal over prior art techniques, resulting in increased productivity and lower cost.

The present invention has been described with reference to the preferred embodiment. Obvious modifications and alterations will occur to others upon reading and understanding the preceding detailed description. For example, while described in connection with the growth of a SiC crystal, the present invention is not to be construed as limited to the growth of SiC crystals since it is envisioned that the present invention may also be utilized to grow other types of crystals. Moreover, the temperatures and pressures (vacuums) described herein are exemplary and are not to be construed as limiting the invention, since it is envisioned that for each step of the process any suitable and/or desirable temperature and/or pressure may be utilized. It is intended that the invention be construed as including all such modifications and alterations insofar as they come within the scope of the appended claims or the equivalents thereof.

The invention claimed is:

1. A method of growing a crystal inside a crystal growth chamber, said method comprising:
   (a) providing a crystal growth chamber having therein at least one component formed of a material that absorbs at least one gas that is a donor impurity in the growth of crystals in the chamber, said chamber further including therein a source material and a seed crystal;
   (b) heating the interior of the chamber to a first, elevated temperature in the presence of a first pressure whereupon the combination of the first temperature and the first pressure is sufficient to degas the at least one gas from the component;
   (c) exposing the interior of the chamber to an inert gas at a second, elevated temperature in the presence of a second pressure, wherein the second temperature is higher than the first temperature and higher than a third, desired crystal growth temperature which is also higher than the first temperature, and the second pressure is greater than the first pressure;
   (d) reducing the inert gas pressure in the chamber to a third pressure that is between the first pressure and the second pressure; and (e) lowering the temperature inside the chamber to the third, desired crystal growth temperature whereupon the source material sublimates (changes from a solid into a vapor) and the vapor from said sublimation deposits on the seed crystal, wherein each of the first, second and third temperatures is established by controlled heating of the interior of the chamber.

2. The method of claim 1, wherein steps (b)-(e) occur in the listed order.

3. The method of claim 1, wherein steps (b)-(e) occur absent exposing the interior of the chamber to the ambient atmosphere and/or absent exposing the interior of the chamber to temperature less than the first temperature.

4. The method of claim 1, wherein:
step (b) is performed for a period between 12 and 18 hours; and/or
step (c) is performed for a period of between 18 and 30 hours.

5. The method of claim 1, wherein:
the first temperature is about 1200° C.;
the second temperature is 50 to 150° C. above the third temperature; and/or
the third temperature is between 2000 and 2400° C.

6. The method of claim 1, wherein:
the first pressure is between $10^{-5}$ and $10^{-7}$ Torr;
the second pressure is between 200 and 600 Torr; and/or
the third pressure is between 1 and 100 Torr.

7. The method of claim 1, wherein the seed crystal and the crystal being grown are made from SiC.

8. A crystal produced according to the method of claim 1.

* * * * *